US012231233B2

(12) United States Patent
Lawson et al.

(10) Patent No.: US 12,231,233 B2
(45) Date of Patent: Feb. 18, 2025

(54) FORWARD ERROR CORRECTION BYPASS FOR REDUCED POWER

(71) Applicant: Cisco Technology, Inc., San Jose, CA (US)

(72) Inventors: Matthew T. Lawson, Grass Valley, CA (US); Jason A. Marinshaw, Santa Clara, CA (US); Mohammad Issa, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 18/176,345

(22) Filed: Feb. 28, 2023

(65) Prior Publication Data

US 2024/0048268 A1 Feb. 8, 2024

Related U.S. Application Data

(60) Provisional application No. 63/370,582, filed on Aug. 5, 2022, provisional application No. 63/370,564, filed on Aug. 5, 2022.

(51) Int. Cl.
*H04L 1/00* (2006.01)

(52) U.S. Cl.
CPC .................. *H04L 1/0041* (2013.01)

(58) Field of Classification Search
CPC ... H04L 1/0009; H04L 1/0041; H04L 1/0042; H04L 1/0045; H04L 1/0057; H03M 13/35; H03M 13/09; H03M 13/1515; H03M 13/353; H03M 13/2906

See application file for complete search history.

(56) References Cited

U.S. PATENT DOCUMENTS

| 6,775,799 B1* | 8/2004 | Giorgetta .............. H03M 13/35 714/751 |
| 11,070,312 B1 | 7/2021 | Oveis Gharan et al. |
| 2003/0061562 A1 | 3/2003 | Ishiwatari et al. |
| 2005/0066250 A1* | 3/2005 | Coleman ............. H03M 13/353 714/752 |
| 2005/0149821 A1 | 7/2005 | Lee et al. |
| 2009/0300468 A1 | 12/2009 | Pekonen |
| 2010/0275103 A1 | 10/2010 | Okumura |
| 2011/0258511 A1* | 10/2011 | Mayo .................... H04W 28/06 714/755 |

(Continued)

FOREIGN PATENT DOCUMENTS

WO 2010048854 A1 5/2010

OTHER PUBLICATIONS

International Search Report and Written Opinion for International Application No. PCT/US2023/071282, mailed Jan. 9, 2024, 22 Pages.

(Continued)

*Primary Examiner* — Shelly A Chase
(74) *Attorney, Agent, or Firm* — Patterson + Sheridan, LLP

(57) ABSTRACT

Techniques for forward error correction are disclosed. These techniques include receiving a forward error correction codeword transmitted over a communication network, the codeword including a parity portion and a payload portion. The techniques further include determining, based on the parity portion, to disable forward error correction for the codeword. The techniques further include disabling forward error correction for the codeword.

17 Claims, 6 Drawing Sheets

(56) References Cited

U.S. PATENT DOCUMENTS

2016/0127081 A1   5/2016  Effenberger
2019/0190653 A1   6/2019  Langhammer et al.

OTHER PUBLICATIONS

Partial International Search Report for International Application No. PCT/US2023/071282, mailed Nov. 14, 2023, 14 Pages.

\* cited by examiner

|  | VARIANT 1 | VARIANT 2 | VARIANT 3 | VARIANT 4 |
|---|---|---|---|---|
| VALUE 1 | 56'hRANDOM0 | 56'hRANDOM5 | 56'hRANDOM10 | 56'hRANDOM15 |
| VALUE 2 | 56'hRANDOM1 | 56'hRANDOM6 | 56'hRANDOM11 | 56'hRANDOM16 |
| VALUE 3 | 56'hRANDOM2 | 56'hRANDOM7 | 56'hRANDOM12 | 56'hRANDOM17 |
| VALUE 4 | 56'hRANDOM3 | 56'hRANDOM8 | 56'hRANDOM13 | 56'hRANDOM18 |
| VALUE 5 | 56'hRANDOM4 | 56'hRANDOM9 | 56'hRANDOM14 | 56'hRANDOM19 |

*Fig. 5*

FORWARD ERROR CORRECTION BYPASS FOR REDUCED POWER

CROSS-REFERENCE TO RELATED APPLICATIONS

This application claims benefit of co-pending U.S. provisional patent application Ser. No. 63/370,564 filed Aug. 5, 2022, and co-pending U.S. provisional patent application Ser. No. 63/370,582 filed Aug. 5, 2022. The aforementioned related patent applications are herein incorporated by reference in their entirety.

TECHNICAL FIELD

Embodiments presented in this disclosure generally relate to networked communications. More specifically, embodiments disclosed herein relate to dynamic forward error correction.

BACKGROUND

Reed Solomon Forward Error Correction (RS FEC) and similar forward error correction (FEC) techniques, typically consist of a message "payload" that includes the information that must be correctly transmitted across a medium, and a parity value that is appended to the message and is used to correct errors in the message. For example, the payload data can be corrupted due to losses in the transmission medium. The parity value can be used to correct the errors and reconstruct the payload.

The combination of the payload message and parity value(s) is commonly called a codeword. The message is passed through an encode block that generates a parity value of N bits. This can be thought of as similar to a cyclic redundancy check (CRC) value (e.g., four bits) appended to an Ethernet® packet to allow for verifying the integrity of the packet. Typically, a CRC simply verifies the integrity of data, however, while FEC both verifies integrity and also allows for correction of the errors.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIG. 5 illustrates random parity values for dynamic FEC, according to one embodiment.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
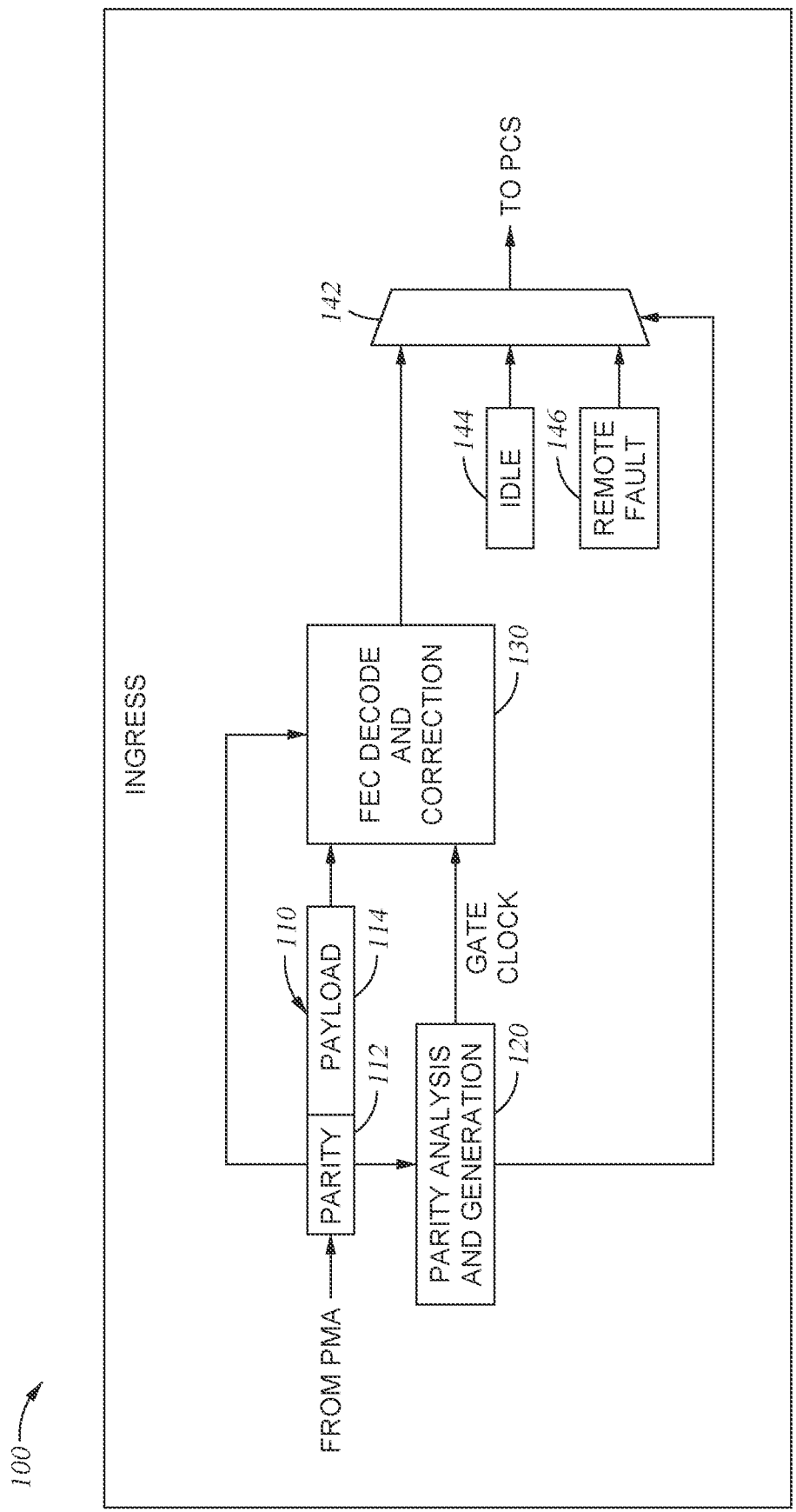
FIG. 1A illustrates an ingress system for dynamic FEC, according to one embodiment.

Embodiments include a method. The method includes receiving a forward error correction codeword transmitted over a communication network, the codeword including a parity portion and a payload portion. The method further includes determining, based on the parity portion, to disable forward error correction for the codeword. The method further includes disabling forward error correction for the codeword.

Embodiments further include a system, including parity analysis logic, forward error correction logic, and a multiplexer. The parity analysis logic is configured to determine, based on a parity portion of a forward error correction codeword, to disable the forward error correction logic for the codeword. The parity analysis logic is further configured to control the multiplexer to output a value for a payload portion of the codeword, based on the parity portion of the codeword.

Embodiments further include a method. The method includes receiving a status relating to transmission of a network message over a communication network. The method further includes determining, based on the status, to bypass forward error correction for the network message. The method further includes generating a parity value for a forward error correction codeword based on the received status. The method further includes transmitting the forward error codeword over the communication network.

Example Embodiments

While FEC is extremely important in many circumstances, where a network message includes trivial information that can be summarized with a value known at the receiver, it is both unnecessary and wasteful to undertake FEC, especially in terms of power. In general, a network message can include any data, including packet data, pause frames, an IDLE control code, fault signaling, or any other suitable data. If the message is simplistic, such as "all IDLE control codes" or "all remote fault codes," then FEC can be bypassed. The actual content of the message can be abbreviated to a value known at the receiver prior to receipt of the message (e.g., "all IDLE" or "all Remote Fault").

In this circumstance, the actual message is not required at the receiver, just the indication that the message is bypassable and an indication of what the known value should be. Thus the message does not need to be corrected in the receiver, so long as the message is received. The parity value generated for the message can be discarded and replaced with a specific value that is used to convey the message "message is all IDLE" or "message is all remote fault." On the receive side of the channel, after the complete codeword is received and the parity value examined, the FEC decode logic can use this special parity message to generate a replica of the original message, and temporarily disable (e.g., clock gate) the FEC correction logic.

This can result in significant improvements, especially in terms of power savings, by avoiding correction where it is not necessary. Correction effort (i.e., power) is constant for typical FEC schemes. If the correction can be bypassed, as discussed further below in relation to FIGS. 1A-5, then the power can be saved. For example, in active channels, assume that 50% of traffic may be idle, and 25% of the time the entire codeword may simply reflect an IDLE message. Disabling FEC for these IDLE messages can result in a very significant power savings. And for IDLE channels, the savings can be even greater. Assume for an IDLE channel that 95% of the transmissions are IDLE and 75% of the time the entire codeword reflects an IDLE message. Disabling FEC for the IDLE message results in even greater power savings.

FIG. 1A illustrates an ingress system 100 for dynamic FEC, according to one embodiment. In an embodiment, the system 100 relates to a receiver (i.e., ingress) for a network message using FEC (e.g., RS FEC). A codeword 110 is received from a physical media attachment (PMA) layer. The codeword 110 includes a parity portion 112 and a payload portion 114. As discussed above, in an embodiment the parity portion 112 can be used to both identify errors in the payload portion 114, and correct those errors at the receiver (e.g., errors stemming from transmission over the transmission medium).

The parity portion 112 is evaluated using parity analysis and generation logic 120. For example, as discussed above, for bypassable messages that include trivial information, FEC is unnecessary and wasteful. In this circumstance, instead of including FEC parity bits in the parity portion 112, the parity portion 112 can itself be a message indicating the contents of the payload 114. For example, the parity portion 112 can indicate that the payload 114 is an idle message, a remote fault message, or another suitable bypassable message.

In an embodiment, the parity analysis and generation logic 120 reads the parity portion 112 and identifies whether it is a typical FEC parity value, or includes a message indicating that the payload portion 114 includes a bypassable value. If the parity analysis and generation logic 120 determines that the parity portion 112 is a typical FEC parity value, it activates the FEC decode and correction logic 130. For example, the FEC decode and correction logic 130 can perform typical FEC (e.g., RS FEC) for the codeword 110. The parity analysis and generation logic 120 can activate the FEC decode and correction logic 130 by setting a clock input to high (e.g., activating the FEC decode and correction logic 130), setting a gate_clock value to low (e.g., failing to gate the clock for the FEC decode and correction logic 130), or using any other suitable technique.

In an embodiment, if the parity analysis and generation logic 120 determines that the parity portion 112 includes a message indicating that the payload portion 114 is bypassable, the parity analysis and generation logic 120 disables the FEC decode and correction logic 130. For example, the parity analysis and generation logic 120 can disable FEC decode and correction by clock gating logic for performing FEC (e.g., clock gating the FEC decode and correction logic 130). This disables the FEC decode and correction logic 130 from actually attempting to error correct the payload 114, and significantly reduces, or eliminates, the power used by the FEC decode and correction logic 130.

Further, in an embodiment, the parity analysis and generation logic 120 controls a component 142 (e.g., a multiplexer) to select the value to pass to the output of the system 100 and a physical coding sublayer (PCS). For example, the parity analysis and generation logic 120 could determine that the parity portion 112 indicates that the payload portion 114 is an IDLE message, and could transmit a signal to the multiplexer 142 to select the IDLE value 144 for the output to PCS. As another example, the parity analysis and generation logic 120 could determine that the parity portion 112 indicates that the payload portion 114 is a remote fault message, and could transmit a signal to the multiplexer 142 to select the remote fault value 146 for the output to PCS. These are merely examples, and the parity analysis and generation logic 120 can select any suitable value for the output to PCS. Further, where the parity analysis and generation logic 120 determines that the parity portion 112 does not indicate a bypassable message, the parity analysis and generation logic 120 can transmit a signal to the multiplexer 142 to select the output of the FEC decode and correction logic 130 as the output to PCS.

In an embodiment, the parity portion 112 can further include a flag indicating that a next message can also be bypassed. For example, a number of IDLE message are often transmitted in succession. A parity portion 112 for an IDLE message could indicate both that the current message can be bypassed, and that the next message could be bypassed. The parity generation and analysis logic 120 could recognize the flag and avoid performing a parity generation and check for the next received codeword. In addition, the storage of the codeword in 114 can also be bypassed. This additional power saving step can only be performed if the current parity contains the flag.

Figure 1B:
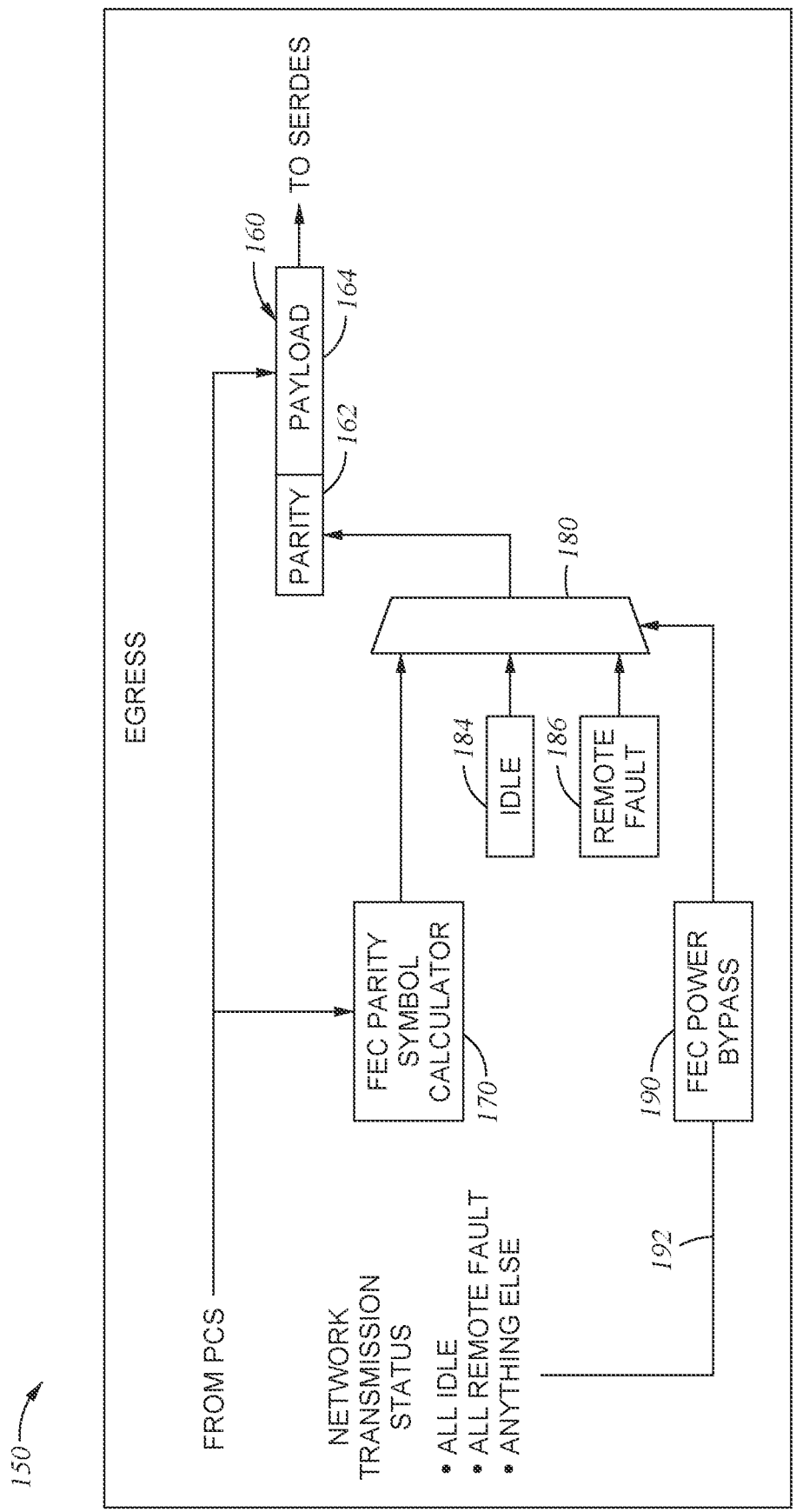
FIG. 1B illustrates an egress system for dynamic FEC, according to one embodiment.

FIG. 1B illustrates an egress system 150 for dynamic FEC, according to one embodiment. In an embodiment, the system 150 relates to a transmitter (i.e., egress) for a network message using FEC (e.g., RS FEC). For example, the system 150 can be used to transmit a network message for receipt by the ingress system 100 illustrated in FIG. 1A.

In an embodiment, data is received from PCS and both provided to an FEC parity symbol calculator 170 and used to generate a payload portion 164 of a codeword 160. The codeword 160 includes both a parity portion 162 and a payload portion 164. As discussed above, in an embodiment the parity portion 162 can be used to both identify errors in the payload portion 164, and correct those errors at the receiver (e.g., errors stemming from transmission over the transmission medium). In an embodiment, the codeword is transmitted out of the egress system (e.g., to a suitable serializer/de-serializer (SERDES)).

In an embodiment, the FEC parity symbol calculator 170 generates a typical parity value for FEC, which is then provides as one input to a component 180 (e.g., a multiplexer). The multiplexer 180 has multiple inputs, including the output of the FEC parity symbol calculator 170, and selects among those inputs to use as the value for the parity portion 162. For example, the multiplexer 180 can also have one or more inputs indicating bypassable values for the payload portion 164. This can include, for example, an IDLE value 184, and a remote fault value 186. These are merely examples, and the multiplexer 180 can select among any suitable inputs.

In an embodiment, the output of the multiplexer 180 is controlled by FEC power bypass logic 190. For example, the FEC power bypass logic 190 can receive a network transmission status indication 192 (e.g., from another layer). The network transmission status indication 192 can indicate whether the payload 164 includes a bypassable value (e.g., all IDLE values, all remote fault values, or any other suitable bypassable value) or non-bypassable data. The FEC power bypass logic 190 can then use the network transmission status indication 192 to select the appropriate input from the multiplexer 180 to set as the value for the parity portion 162: the typical FEC parity symbol, or a value indicating that the payload portion 164 is a bypassable message (e.g., an IDLE message or a remote fault message).

Figure 2:
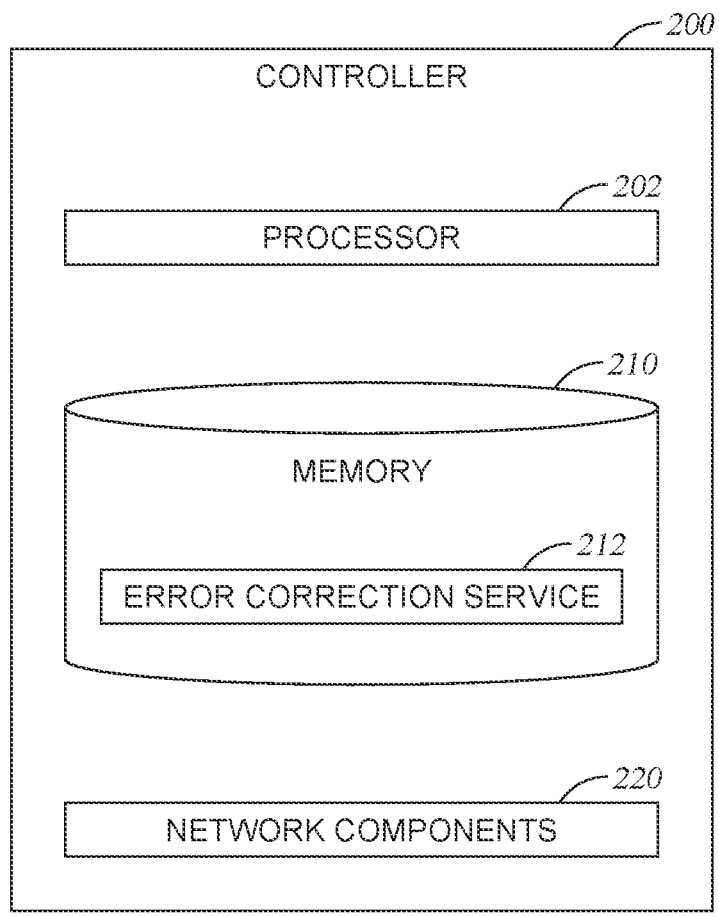
FIG. 2 is a block diagram illustrating a controller for dynamic FEC, according to one embodiment.

In an embodiment, a network communication system including the ingress system 100 illustrated in FIG. 1A and the egress system 150 illustrated in FIG. 1B could further include scrambling of message contents. For example, data can be scrambled at egress (e.g., using a scrambler) and de-scrambled at ingress (e.g., using a de-scrambler). In this embodiment, the transmission system could save the scrambler state at the end of each FEC payload interval, and either continue to advance the scrambler seed, or revert to the previously stored seed if the message was deemed bypassable. With this method, the scrambler does not advance when the message is bypassable. Correspondingly, the receiving side descrambler would perform the same function: if the message is flagged as bypassable, the descrambler does not advance or descramble the data, resulting in an additional power saving benefit FIG. 2 is a block diagram illustrating a controller for dynamic FEC, according to one embodiment. In an embodiment, the controller 200 provides input for the egress system 150 illustrated in FIG. 1B (e.g., the network transmission status 192) and controls transmission and receipt of data using the ingress system 100 illustrated in FIG. 1A and the egress system 150 illustrated in FIG. 1B.

The controller 200 includes a processor 202, a memory 210, and network components 220. The processor 202 generally retrieves and executes programming instructions stored in the memory 210. The processor 202 is included to be representative of a single central processing unit (CPU), multiple CPUs, a single CPU having multiple processing cores, graphics processing units (GPUs) having multiple execution paths, and the like.

The network components 220 include the components necessary for the controller 200 to interface with a wireless communication network, as discussed above in relation to FIGS. 1A-B. For example, the network components 220 can include WiFi or cellular network interface components and associated software.

Although the memory 210 is shown as a single entity, the memory 210 may include one or more memory devices having blocks of memory associated with physical addresses, such as random access memory (RAM), read only memory (ROM), flash memory, or other types of volatile and/or non-volatile memory. The memory 210 generally includes program code for performing various functions related to use of the controller 200. The program code is generally described as various functional "applications" or "modules" within the memory 210, although alternate implementations may have different functions and/or combinations of functions. Within the memory 210, an error correction service 212 facilitates dynamic error correction, as discussed above in relation to FIGS. 1A-B and below in relation to FIGS. 3-4.

Figure 3:
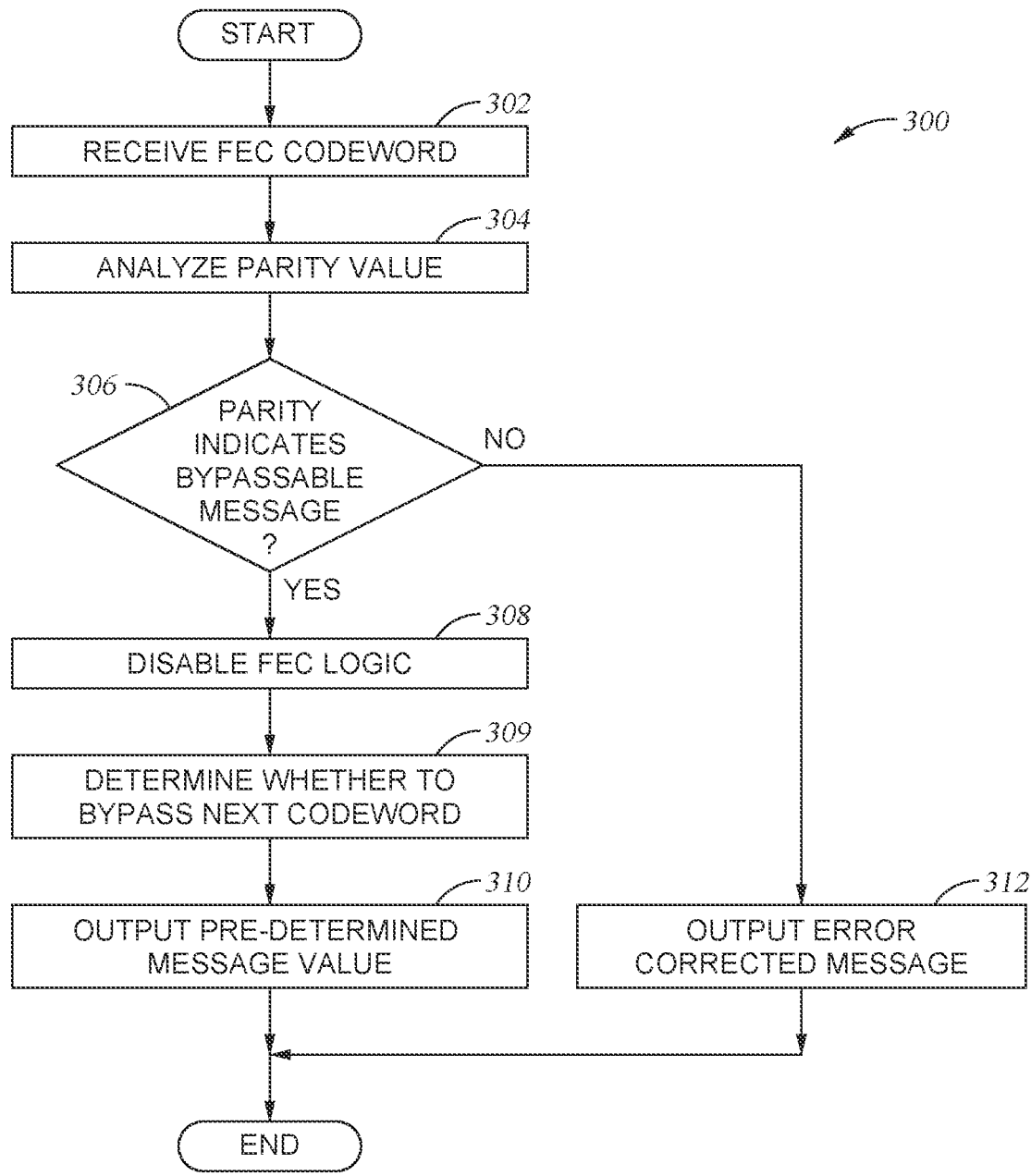
FIG. 3 is a flowchart illustrating ingress for dynamic FEC, according to one embodiment.

FIG. 3 is a flowchart 300 illustrating ingress for dynamic FEC, according to one embodiment. As discussed above, FIG. 1A illustrates an example ingress system for dynamic FEC. FIG. 3 illustrates a flow for dynamic FEC (e.g., using the system illustrated in FIG. 1A), according to one embodiment.

At block 302 a receiver (e.g., the ingress system 100 illustrated in FIG. 1A) receives an FEC codeword (e.g., an RS FEC codeword). For example, the FEC codeword can include a parity portion and a payload portion. In typical FEC systems, the parity portion can be used for error correction of the payload portion.

At block 304, parity analysis logic (e.g., the parity analysis and generation logic 120 illustrated in FIG. 1A) analyzes the parity value. For example, the parity analysis and generation logic 120 can analyze the parity value to determine whether it indicates that the payload portion is a bypassable message that does not need to be error corrected. Examples of suitable parity values are discussed further, below, with regard to FIG. 5.

At block 306, the parity analysis logic determines whether the parity portion indicates a bypassable message. For example, as discussed further below with regard to FIG. 5, the parity portion can include a value designated as indicating that the payload portion is bypassable and does not need to be error corrected. The parity analysis logic can attempt to match the parity portion to this designated value, to determine whether the payload portion is bypassable.

In an embodiment, the parity value itself could be subject to corruption during transmission (e.g., for noisy or lossy channels). This can be mitigated using one or more suitable techniques. For example, a repeating value with a signature and control value could be used to filter out bit errors in the parity. As one example, for RS FEC (e.g., used in Ethernet® channels with 50 Gb/s SERDES), the payload portion of a codeword could be 5140 b and the parity value could be 300 b. A repeating value could be used to signal a bypassable message. The parity analysis logic would look for the repeating value and accept it as indicating a bypassable message if multiple instances of the repeating value are found (e.g., three or four instances). Table 1 below shows one example of a suitable parity symbol with a repeating value:

TABLE 1

| FEC mode | Control Code type | Parity Symbol |
|---|---|---|
| RS FEC(544, 514) | IDLE | {56'h<VALUE1>, 4'b0101, 56'h<VALUE2>, 4'b0101, 56'h<VALUE3>, 4'b0101, 56'h<VALUE4>, 4'b0101, 56'h<VALUE5>, 4'b0101} |
| | REMOTE FAULT | [56'h<VALUE1>, 4'b1010, 56'h<VALUE2>, 4'b1010, 56'h<VALUE3>, 4'b1010, 56'h<VALUE4>, 4'b1010, 56'h<VALUE5>, 4'b1010} |
| | RESERVED | {56'h<VALUE1>, 4'bxxxx, 56'h<VALUE2>, 4'bxxxx, 56'h<VALUE3>, 4'bxxxx, 56'h<VALUE4>, 4'bxxxx, 56'h<VALUE5>, 4'bxxxx} |

As illustrated, the repeating "VALUE1, VALUE2, VALUE3, VALUE4, VALUE5" can be used to indicate a bypassable message and alleviate potential transmission errors in the parity value itself. These illustrated values are merely examples, and any suitable parity values can be used. In an embodiment the specific value used does not matter. What matters is the values sent are identifiable such that they can be detected at ingress with a high degree of confidence.

In an embodiment, false negatives or false positives could be a risk of including an indication of a bypassable message in the parity portion of the codeword. False negatives could occur where the parity value has too many errors and is not recognized as indicating a bypassable message. This can be alleviated through the inclusion of repeated values, as discussed above in relation to Table 1. Further, these false negatives would only occur in bypassable messages (e.g., IDLE messages, remote fault messages, or other suitable trivial messages).

False positives could occur when a parity value for a non-bypassable message happens to match a bypassable message indication (e.g., due to transmission errors). In an embodiment, the parity value indictors (e.g., as illustrated in Table 1 above and FIG. 5 below) can be chosen to be sufficiently large to make this very, very unlikely, such that a false positive would be expected to occur only in a timeframe that is longer than the operational timeframe of the network communication system. Further, false positives could be further alleviated by examining message characteristics to determine highly unlikely parity values.

Further, false positives could be avoided by selectively using dynamic FEC only when the transmission channel is sufficiently sound that large numbers of transmission errors are unlikely. For example, a rate (or ratio) of errors during transmission, or a transmission channel quality, could be tracked. If this error rate, or transmission channel quality, meets a threshold, dynamic FEC could be disabled, such that FEC is used for all transmissions.

If the parity analysis logic determines that the parity portion indicates a bypassable message, the flow proceeds to block 308.

At block 308, the parity analysis logic disables the FEC logic. For example, as illustrated above in relation to FIG. 1A, the parity analysis logic can disable the FEC logic by clock gating logic for FEC decode and correction. This is merely an example, and the parity analysis logic can disable the FEC logic using any suitable technique. In an embodiment, disabling the FEC logic reduces the power used by the FEC logic and reduces power used by the ingress system.

At block 309, the parity analysis logic determines whether a next codeword should be bypassed. As discussed above, a parity portion can further include a flag indicating that a next message can also be bypassed. For example, a number of IDLE message are often transmitted in succession. A parity portion for an IDLE message could indicate both that the current message can be bypassed, and that the next message could be bypassed. The parity analysis logic can recognize the flag and avoid performing a parity generation and check for the next received codeword. In addition, the storage of the codeword in can also be bypassed.

At block 310, the ingress system outputs the pre-determined message value (e.g., to the PCS). In an embodiment, the parity portion both indicates that the message is bypassable and indicates what pre-determined value should be used for the message (e.g., an IDLE value or a REMOTE FAULT value). The parity analysis logic identifies what pre-determined value should be used, and the ingress system outputs that value.

For example, as discussed above in relation to FIG. 1A, a multiplexer (e.g., the multiplexer 142) can be used to select which, among multiple input values, should be output from the ingress system. The parity analysis logic can control this multiplexer to output the desired value.

Returning to block 306, if the parity analysis logic determines that the parity portion does not indicate a bypassable message, the flow proceeds to block 312. At block 312, the ingress system outputs the error corrected message (e.g., to the PCS). For example, the ingress system can undertake typical FEC logic (e.g., the FEC decode and correction logic illustrated in FIG. 1A) and can output the result of this logic. If FEC is needed (e.g., based on the parity portion), then the corrected message is output from the ingress system.

Figure 4:
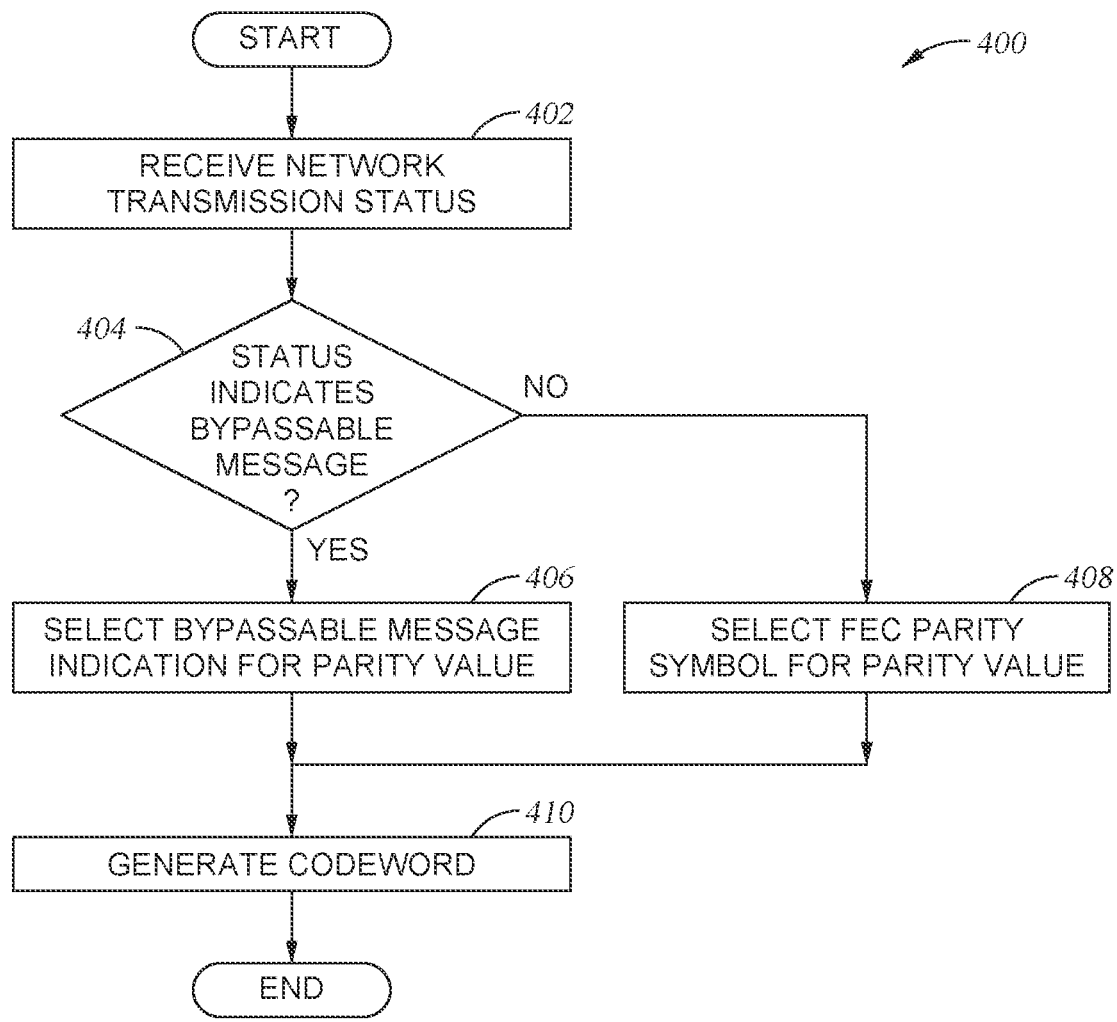
FIG. 4 is a flowchart illustrating egress for dynamic FEC, according to one embodiment.

FIG. 4 is a flowchart 400 illustrating egress for dynamic FEC, according to one embodiment. As discussed above, FIG. 1B illustrates an example egress system for dynamic FEC. FIG. 4 illustrates a flow for dynamic FEC (e.g., using the system illustrated in FIG. 1B), according to one embodiment.

At block 402, FEC power bypass logic (e.g., the FEC power bypass logic 190 illustrated in FIG. 1B) receives network transmission status (e.g., the network transmission status indication 192 illustrated in FIG. 1B). For example, the network transmission status can indicate whether the message is bypassable (e.g., an IDLE message or a remote fault message), or not (e.g., another message for which FEC should not be bypassed). In an embodiment, the network transmission status is provided by another aspect of a network communication system (e.g., a reconciliation layer or another suitable layer).

At block 404, the FEC power bypass logic determines whether the status indicates a bypassable message. If so, the flow proceeds to block 406. If not, the flow proceeds to block 408.

At block 406, an egress system (e.g., the egress system 150 illustrated in FIG. 1B) selects a bypassable message indication for the parity value. For example, the egress system can include a multiplexer (e.g., the multiplexer 180 illustrated in FIG. 1B). The FEC power bypass logic can control the multiplexer to select the correct bypassable message indication, based on the network transmission status. For example, the FEC power bypass logic can control the multiplexer to select between an IDLE indication, a remote fault indication, and any other suitable indication.

Returning to block 404, if the FEC power bypass logic determines that the status indicates a message that is not bypassable (e.g., not IDLE, remote fault, or any other bypassable message), the flow proceeds to block 408. At block 408, the FEC power bypass logic selects an FEC parity symbol for the parity value. For example, the FEC power bypass logic can control the multiplexer to select a calculated FEC parity symbol (e.g., the output of the FEC parity symbol calculator 170 illustrated in FIG. 1B) as the output of the multiplexer.

At block 410, the egress system generates a codeword. In an embodiment, the egress system generates a codeword in which the parity value is set based on the value selected at blocks 406 or 408 (e.g., the bypassable message indication or the FEC parity symbol). The message value is set based on input from the network communication system (e.g., from the PCS). The message can then be transmitted over a suitable communication network (e.g., using a suitable SERDES).

FIG. 5 illustrates a table 500 of random parity values for dynamic FEC, according to one embodiment. In an embodiment, an egress system must follow a number of guidelines for data transmission (e.g., set by an applicable communication standard). For example, an egress system must typically transmit random, non-repeated data (e.g., for security reasons). This can be done, for example, using a scrambler.

In an embodiment, using a single value in a parity portion of a codeword, to indicate a bypassable message for FEC, could violate one or more of these requirements. This can be alleviated, if necessary, by randomizing the parity value indicating a bypassable message. For example, as illustrated in FIG. 5, Values1-5 could indicate various types of bypassable messages (e.g., IDLE messages, remote fault messages, or other suitable bypassable message types). Rather than using a single value to represent each type of message, a random value could be used in the indication.

Thus, in the example illustrated in FIG. 5, each Value1-5 (e.g., the five rows of the table 500) has four possible variants, each including a different random value (e.g., the four Variant columns of the table 500). For example, Value1 has four variants: Variant_1 including Random0, Variant_2 including Random5, Variant_3 including Random10, and Variant_4 including Random15. These variants can be randomly pulled to generate the parity value for transmission. The detection logic (e.g., at ingress) can then look for any of these values to identify the type of bypassable message. For example, the detection logic could look for any of Random0 OR Random5 OR Random10 OR Random15 to identify that a bypassable message of type Value1 has been transmitted. This is merely an example, and any suitable randomization technique can be used (e.g., if necessary).

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:
1. A method, comprising:
receiving a forward error correction codeword transmitted over a communication network, the codeword comprising a parity portion and a payload portion;
determining, based on the parity portion, to disable forward error correction for the codeword;
disabling forward error correction for the codeword;

determining, based on the parity portion, to bypass forward error correction for a next codeword;
bypassing parity generation for the next codeword; and
bypassing storage of the next codeword.

2. The method of claim 1, wherein disabling forward error correction for the codeword comprises clock gating logic relating to performing forward error correction.

3. The method of claim 1, wherein determining, based on the parity portion, to disable forward error correction for the codeword, comprises:
recognizing a value in the parity portion indicating that forward error correction should be disabled.

4. The method of claim 1, further comprising:
generating a value for output, based on the received parity portion, without using the received payload portion.

5. The method of claim 4, wherein the generated value is pre-determined prior to receiving the codeword.

6. The method of claim 5, wherein generating the value comprises:
selecting the value, from among a plurality of choices, based on the received parity portion.

7. The method of claim 4, wherein the value for output indicates at least one of: (i) an IDLE message or (ii) a remote fault message.

8. The method of claim 1,
wherein the parity portion comprises a plurality of repeated values, and
wherein determining, based on the parity portion, to bypass forward error correction for the codeword comprises recognizing at least one of the repeated values in the parity portion.

9. The method of claim 1,
wherein the parity portion comprises a randomly generated value, and
wherein determining, based on the parity portion, to bypass forward error correction for the codeword comprises recognizing the randomly generated value.

10. A system, comprising:
parity analysis logic;
forward error correction logic; and
a multiplexer, wherein:
the parity analysis logic is configured to determine, based on a parity portion of a forward error correction codeword, to disable the forward error correction logic for the codeword,
wherein disabling the forward error correction for the codeword comprises clock gating the forward error correction logic; and
the parity analysis logic is configured to control the multiplexer to output a value for a payload portion of the codeword, based on the parity portion of the codeword.

11. The system of claim 10, wherein the multiplexer is coupled to an output from the forward error correction logic and one or more pre-determined values for the payload portion of the codeword.

12. The system of claim 11, wherein controlling the multiplexer to output the value for the payload portion of the codeword, based on the parity portion of the codeword, comprises selecting one of the one or more pre-determined values.

13. The system of claim 12, wherein the one or more pre-determined values indicate at least one of: (i) an IDLE message or (ii) a remote fault message.

14. A method, comprising:
receiving a status relating to transmission of a network message over a communication network;
determining, based on the status, to bypass forward error correction for the network message;
generating a parity value for a forward error correction codeword based on the received status, comprising:
selecting the parity value, from among a plurality of choices, based on the received status; and
transmitting the forward error codeword over the communication network.

15. The method of claim 14, wherein the parity value is pre-determined prior to receiving the status.

16. The method of claim 15, wherein the parity value indicates at least one of: (i) an IDLE message or (ii) a remote fault message.

17. The method of claim 14,
wherein the parity value comprises a plurality of repeated values, each of the repeated values indicating a type for the network message.

* * * * *